(12) United States Patent
Liu

(10) Patent No.: US 11,916,044 B2
(45) Date of Patent: Feb. 27, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 299 days.

(21) Appl. No.: 17/648,143

(22) Filed: Jan. 17, 2022

(65) Prior Publication Data

US 2022/0384392 A1 Dec. 1, 2022

Related U.S. Application Data

(63) Continuation of application No. PCT/CN2021/113058, filed on Aug. 17, 2021.

(30) Foreign Application Priority Data

May 26, 2021 (CN) .......................... 202110580706.X

(51) Int. Cl.
| | |
|---|---|
| *H01L 23/00* | (2006.01) |
| *H01L 25/065* | (2023.01) |
| *H01L 23/48* | (2006.01) |
| *H01L 21/768* | (2006.01) |
| *H01L 25/00* | (2006.01) |

(52) U.S. Cl.
CPC .... *H01L 25/0657* (2013.01); *H01L 21/76898* (2013.01); *H01L 23/481* (2013.01); *H01L 24/32* (2013.01); *H01L 25/50* (2013.01); *H01L 2224/32145* (2013.01); *H01L 2225/06544* (2013.01)

(58) Field of Classification Search
CPC ....... H01L 24/81; H01L 23/24; H01L 23/481; H01L 25/0657; H01L 21/76898
See application file for complete search history.

(56) References Cited

U.S. PATENT DOCUMENTS

| | | | |
|---|---|---|---|
| 8,437,211 | B2 | 5/2013 | Park |
| 8,564,138 | B2 | 10/2013 | Lee et al. |

(Continued)

FOREIGN PATENT DOCUMENTS

| | | | |
|---|---|---|---|
| CN | 101542726 A | | 9/2009 |
| CN | 102314935 A | | 1/2012 |

(Continued)

OTHER PUBLICATIONS

International Search Report cited in PCT/CN2021/113056 dated Feb. 28, 2022, 8 pages.

*Primary Examiner* — Thao P Le

(74) *Attorney, Agent, or Firm* — Cooper Legal Group, LLC

(57) ABSTRACT

The present disclosure relates to the technical field of semiconductor manufacturing, and provides a semiconductor structure and a manufacturing method thereof. The semiconductor structure includes: a plurality of dies, where the plurality of dies are stacked layer by layer; one or more interlayer dielectric layers, where each of the interlayer dielectric layers is located between adjacent dies; and a plurality of conductive through vias, where at least one of the plurality of conductive through vias penetrates at least two layers of dies and electrically connects the at least two layers of dies.

15 Claims, 9 Drawing Sheets

(56) References Cited

U.S. PATENT DOCUMENTS

| | | | |
|---|---|---|---|
| 9,356,000 B2 | 5/2016 | Lee | |
| 10,950,578 B2 | 3/2021 | Lee et al. | |
| 11,450,675 B2* | 9/2022 | Morris | G11C 11/2257 |
| 11,728,335 B2* | 8/2023 | Liu | H01L 29/0847 |
| | | | 257/368 |
| 2005/0263869 A1 | 12/2005 | Tanaka et al. | |
| 2021/0074709 A1* | 3/2021 | Liu | H01L 21/02013 |
| 2021/0098421 A1* | 4/2021 | Wu | H01L 23/49811 |
| 2021/0193542 A1* | 6/2021 | Chang | H01L 23/49822 |
| 2021/0217715 A1* | 7/2021 | Yu | H01L 21/565 |
| 2021/0249380 A1* | 8/2021 | Chen | H01L 25/105 |
| 2021/0305226 A1* | 9/2021 | Tsai | H01L 25/16 |
| 2022/0028834 A1* | 1/2022 | Lee | H01L 25/0652 |
| 2022/0102280 A1* | 3/2022 | Dabral | H01L 25/0655 |
| 2022/0157744 A1* | 5/2022 | Chiang | H01L 24/16 |
| 2022/0293492 A1* | 9/2022 | Fujiwara | G11C 11/4085 |
| 2022/0310514 A1* | 9/2022 | Wei | H01L 23/485 |
| 2022/0320019 A1* | 10/2022 | Chang | H01L 23/145 |

FOREIGN PATENT DOCUMENTS

| | | |
|---|---|---|
| CN | 102751258 A | 10/2012 |
| CN | 103887288 A | 6/2014 |

\* cited by examiner

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2021/113056, titled "SEMICONDUCTOR STRUCTURE AND MANUFACTURING METHOD THEREOF" and filed on Aug. 17, 2021, which claims the priority to Chinese Patent Application 202110580706.X, titled "SEMICONDUCTOR STRUCTURE AND MANUFACTURING METHOD THEREOF" and filed with the China National Intellectual Property Administration (CNIPA) on May 26, 2021. The entire contents of International Patent Application No. PCT/CN2021/113056 and Chinese Patent Application 202110580706.X are incorporated herein by reference.

TECHNICAL FIELD

The present disclosure relates to the technical field of semiconductors, and in particular to a semiconductor structure and a manufacturing method thereof.

BACKGROUND

With the continuous development of integrated circuit design and manufacturing, in the technical field of packaging, a common 2D package structure causes the problem of long lines, which reduces the computing speed and increases the power consumption of the circuit. A 3D package structure comes into being. The 3D package structure can effectively reduce the line length, increase the computing speed and reduce power consumption.

In the 3D package structure, a plurality of dies are stacked layer by layer to reduce the plane area of the dies. In addition, the interconnection between a plurality of layers of dies can be realized by trough-silicon via (TSV) structures. In the current 3D package structure, a TSV structure is arranged in each layer of die and an interconnecting structure is arranged between adjacent dies. The TSV structures in adjacent dies are electrically connected through the interconnecting structure to realize the electrical conduction between the plurality of layers of dies.

However, the flatness of the current TSV structure is low, which affects the performance of the dies, and the overall size of the stacked dies is large.

SUMMARY

According to a first aspect, the present disclosure provides a semiconductor structure, inducing: a plurality of dies, wherein the plurality of dies are stacked layer by layer;

one or more interlayer dielectric layers, wherein each of the interlayer dielectric layers is located between adjacent dies; and a plurality of conductive through vias, where at least one of the plurality of conductive through vias penetrates at least two layers of dies and electrically connects the at least two layers of dies.

According to a second aspect, the present disclosure provides a method of manufacturing a semiconductor structure, including:

providing a plurality of dies being stacked layer by layer, where an interlayer dielectric layer is provided between every two adjacent dies; and forming conductive through vias in at least two layers of dies, where each of the conductive through vias penetrates the at least two layers of dies.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and those of ordinary skill in the art may still derive other drawings from these drawings without creative efforts.

DETAILED DESCRIPTION

Figure 1:
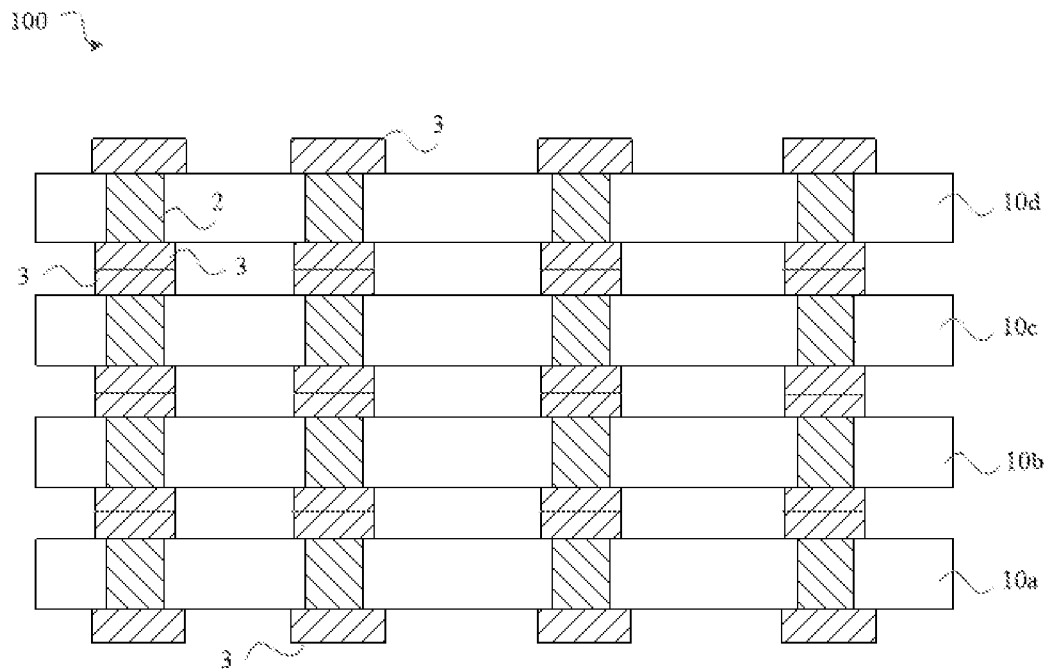
FIG. 1 is a schematic structural diagram of (a partial structure of) a semiconductor structure in the related art.

With the continuous development of integrated circuit design and manufacturing, in the technical field of packaging, a common 2D package structure causes the problem of long lines, which reduces the computing speed and increases the power consumption of the circuit. A 3D package structure comes into being. The 3D package structure can effectively reduce the line length, increase the computing speed and reduce power consumption. In the 3D package structure, a plurality of dies are stacked layer by layer to reduce the plane area of the dies. In addition, the interconnection between a plurality of layers of dies can be realized by through-silicon via (TSV) structures. FIG. 1 is a schematic structural diagram of (a partial structure of) a semiconductor structure in the related art. As shown in FIG. 1, a current 3D package structure includes a first die 10a, a second die 10b, a third die 10c, and a fourth die 10d that are stacked layer by layer. A conductive through via 2 (i.e., TSV structure) is arranged in each layer of die and an interconnecting structure 3 is arranged between adjacent dies. The conductive through vias 2 in adjacent dies are electrically connected through the interconnecting structure 3 to realize the electrical conduction between the plurality of layers of dies.

However, the current TSV structure has the following problems: on the one hand, when the planarization process is carried out after deposition of the conductive material, it is easy to over-grind the conductive metal, resulting in low flatness of the TSV structure; on the other hand, the conductive metal of the TSV structure expands during thermal treatment, and the surface in contact with the interconnecting structure 3 will delaminate or bulge, resulting in a decrease in the flatness of the TSV structure, thus affecting the use performance of the dies. In addition, the interconnecting structure 3 between dies tends to increase the overall size of the stacked dies.

In the semiconductor structure and the manufacturing method thereof provided by the present disclosure, the interlayer dielectric layer is provided, which can fill the gap between adjacent dies on the one hand, and on the other hand, can connect the adjacent dies, thus improving the stability of the stacked dies. By providing a plurality of conductive through vias, the plurality of dies can be electrically connected to each other. The conductive through vias penetrate at least two layers of dies. On the one hand, the planarization process on the conductive through vias of adjacent dies is avoided, thereby preventing a flatness difference due to excessive grinding on the metal layer of the conductive through vias. On the other hand, delamination or bulging during thermal treatment can be avoided after bonding of the interconnecting structure and the conductive through vias. The settings described above reduce the impact of the flatness of the conductive through vias on the performance of the semiconductor structure. In addition, because the adjacent dies are electrically connected by using the same conductive through via, it is unnecessary to provide an interconnecting structure between the adjacent dies, thus reducing the overall size of the semiconductor structure.

To make the objective, technical solutions and advantages of the present disclosure clearer, the technical solutions in the embodiments of the present disclosure are described in more detail below with reference to the drawings in the preferred embodiments of the present disclosure. The same or similar reference numerals represent the same or similar components or components having the same or similar functions throughout the specification. The described embodiments are some rather than all of the embodiments of the present disclosure. The embodiments described below with reference to the drawings are exemplary, and are merely intended to explain the present disclosure, rather than to limit the present disclosure. All other embodiments obtained by those of ordinary skill in the art based on the embodiments of the present disclosure without creative efforts should fall within the protection scope of the present disclosure. The embodiments of the present disclosure are described in detail below with reference to the drawings.

Figure 2:
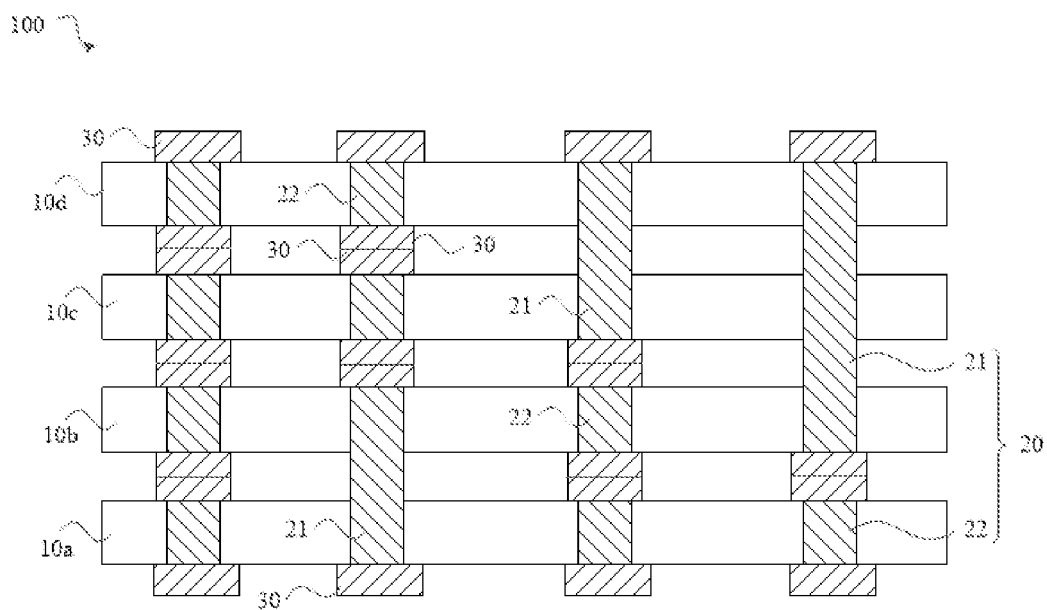
FIG. 2 is a schematic structural diagram of (a partial structure of) a first semiconductor structure according to an embodiment of the present disclosure.
Figure 3:
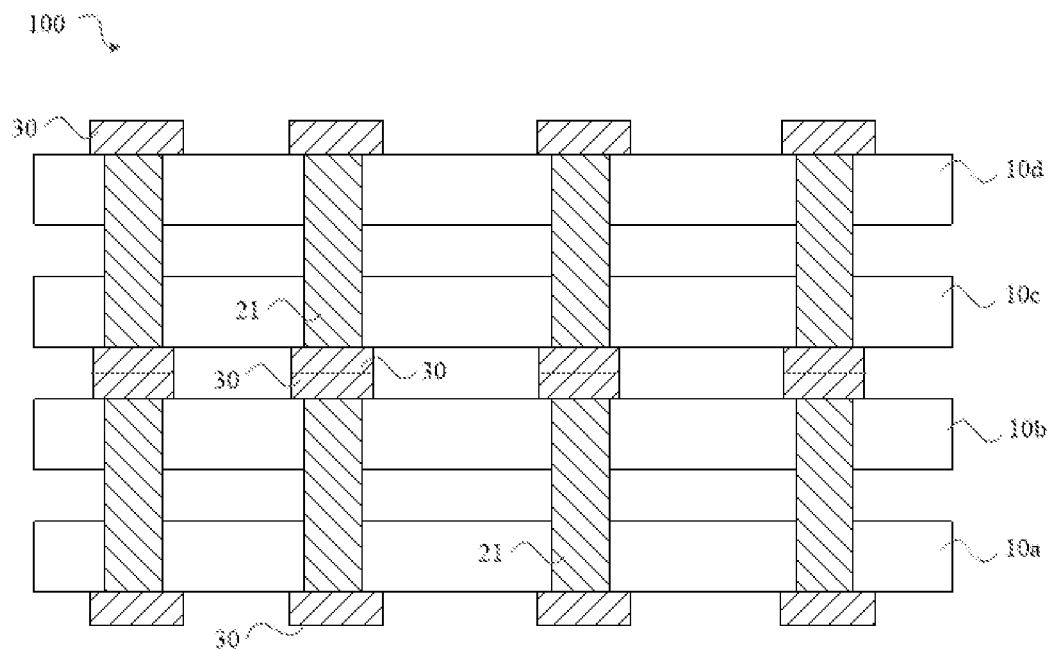
FIG. 3 is a schematic structural diagram of (a partial structure of) a second semiconductor structure according to an embodiment of the present disclosure.
Figure 4:
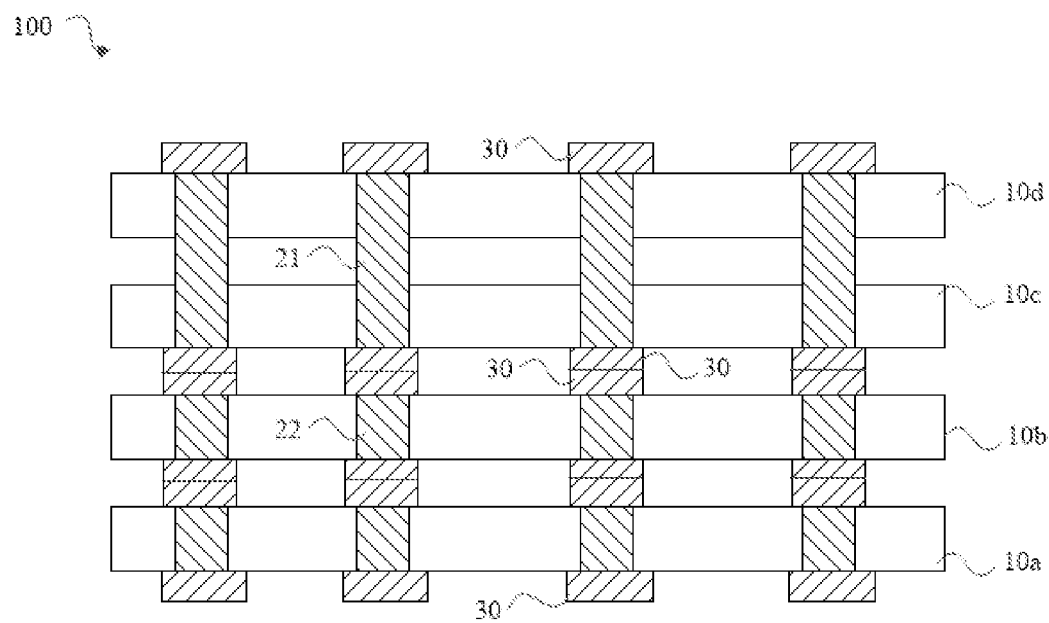
FIG. 4 is a schematic structural diagram of (a partial structure of) a third semiconductor structure according to an embodiment of the present disclosure.
Figure 5:
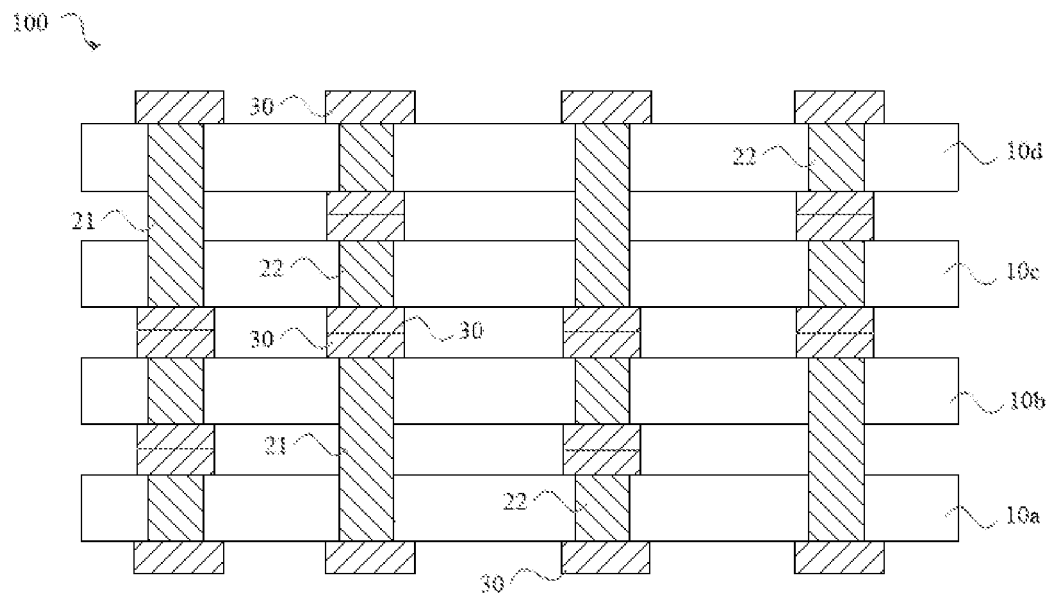
FIG. 5 is a schematic structural diagram of (a partial structure of) a fourth semiconductor structure according to an embodiment of the present disclosure.
Figure 6:
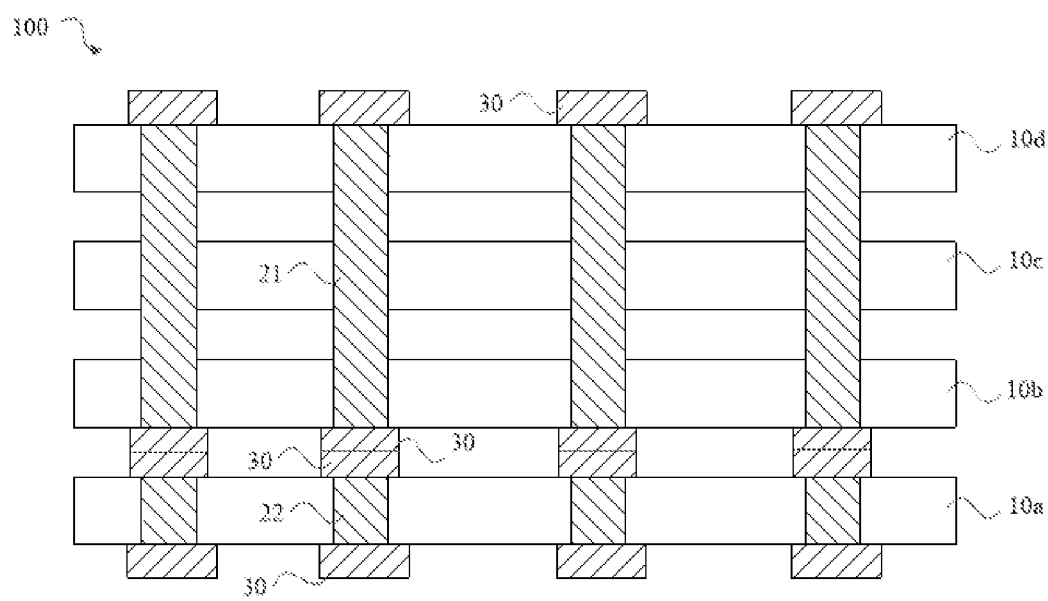
FIG. 6 is a schematic structural diagram of (a partial structure of) a fifth semiconductor structure according to an embodiment of the present disclosure.
Figure 7:
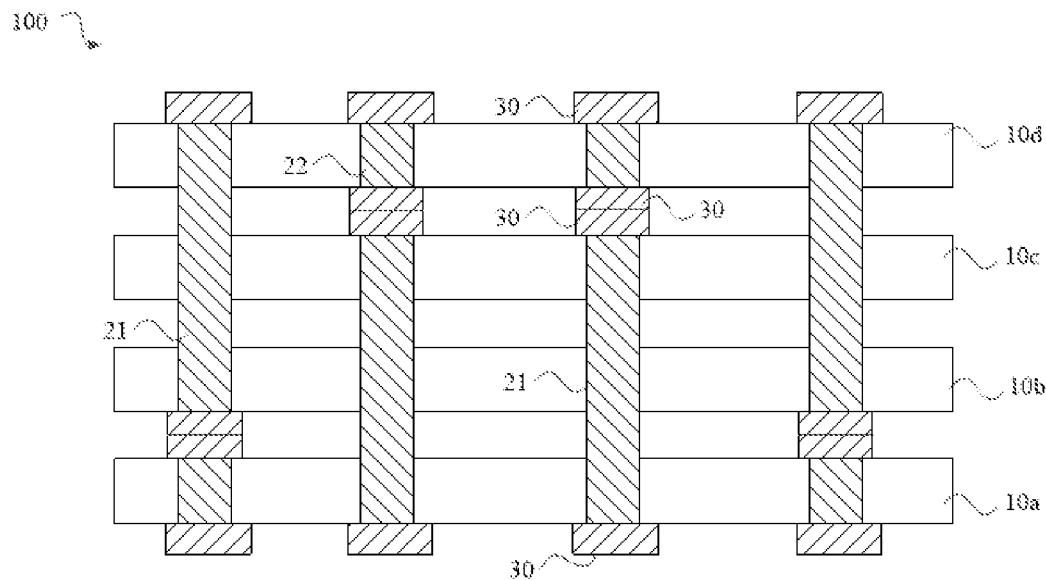
FIG. 7 is a schematic structural diagram of (a partial structure of) a sixth semiconductor structure according to an embodiment of the present disclosure.
Figure 8:
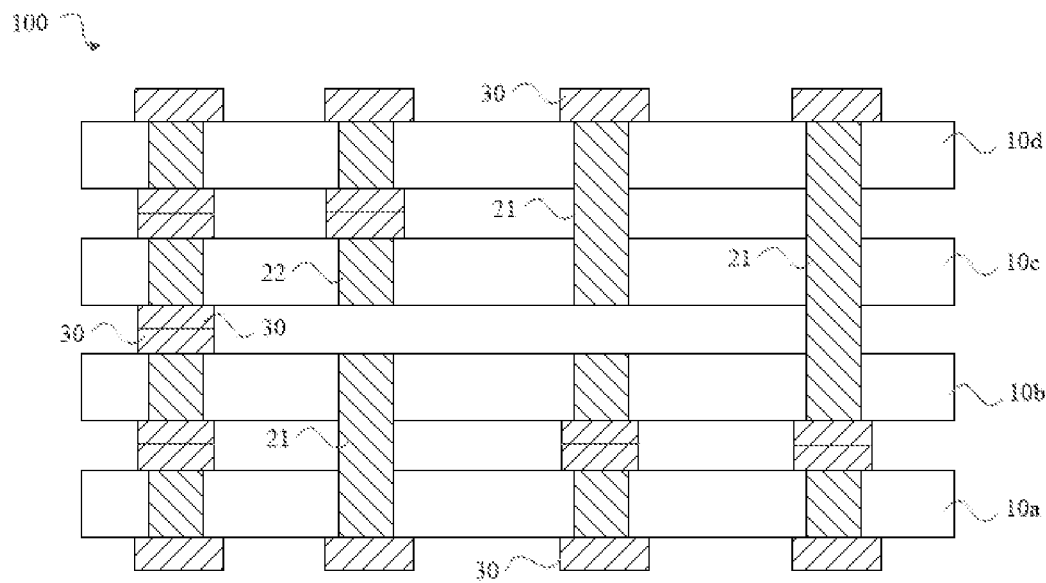
FIG. 8 is a schematic structural diagram of (a partial structure of) a seventh semiconductor structure according to an embodiment of the present disclosure.

FIG. 2 is a schematic structural diagram of (a partial structure of) a first semiconductor structure according to an embodiment of the present disclosure. FIG. 3 is a schematic structural diagram of (a partial structure of) a second semiconductor structure according to an embodiment of the present disclosure. FIG. 4 is a schematic structural diagram of (a partial structure of) a third semiconductor structure according to an embodiment of the present disclosure. FIG. 5 is a schematic structural diagram of (a partial structure of) a fourth semiconductor structure according to an embodiment of the present disclosure. FIG. 6 is a schematic structural diagram of (a partial structure of) a fifth semiconductor structure according to an embodiment of the present disclosure. FIG. 7 is a schematic structural diagram of (a partial structure of) a sixth semiconductor structure according to an embodiment of the present disclosure. FIG. 8 is a schematic structural diagram of (a partial structure of) a seventh semiconductor structure according to an embodiment of the present disclosure. With reference to FIG. 2 to FIG. 8, according to one aspect, an embodiment of the present disclosure provides a semiconductor structure.

As shown in FIG. 2, the semiconductor structure 100 includes: a plurality of dies, one or more interlayer dielectric layers (not shown), and a plurality of conductive through vias 20. Specifically, the plurality of dies are stacked layer by layer, and each interlayer dielectric layer is located between adjacent dies. At least one of the plurality of conductive through vias 20 penetrates at least two layers of dies and electrically connects the at least two layers of dies. In this embodiment of the present disclosure, the semiconductor structure 100 specifically includes a first die 10a, a second die 10b, a third die 10c, and a fourth die 10d that are sequentially stacked. By providing a plurality of conductive through vias 20, the plurality of dies can be electrically connected to each other. The conductive through vias 20 penetrate at least two layers of dies. On the one hand, the planarization process on the conductive through vias 20 of adjacent dies is avoided, thereby preventing a flatness difference due to excessive grinding on the metal layer of the conductive through vias 20. On the other hand, delamination or bulging during thermal treatment can be avoided after bonding of the interconnecting structure 30 and the conductive through vias 20. The settings described above reduce the impact of the flatness of the conductive through vias 20 on the storage performance of the semiconductor structure 100. In addition, because the adjacent dies are electrically connected by using the same conductive through via 20, it is unnecessary to provide an interconnecting structure 30 between the adjacent dies, thus reducing the process difficulty of semiconductor packaging and the overall size of the semiconductor structure 100.

It should be noted that the interlayer dielectric layer can be formed by a non-conductive adhesive or non-conductive tape with a melting effect. The interlayer dielectric layer can fill the gap between dies and also cover the side surface of each die. The interlayer dielectric layer can fill the gap between adjacent dies on the one hand, and connect adjacent dies on the other hand, thus improving the stability of stacked dies.

It should be noted that the die can include a semiconductor base and an integrated circuit layer provided on the semiconductor base. The semiconductor base can include, for example, a Group IV material wafer or a Group III-V compound wafer. In addition, depending on the forming method, the semiconductor wafer may be a monocrystalline wafer, such as a monocrystalline silicon wafer. However, the semiconductor wafer is not limited to the monocrystalline wafer. That is, various wafers such as an epitaxial wafer, a polished wafer, an annealed wafer, or a silicon on insulator wafer can be used as the semiconductor base. In addition, a plurality of dies can be stacked on a support base (not shown), which can be made of silicon, glass, ceramic, or plastic.

It should be noted that the dies may be memory devices or non-memory devices. The memory device may include, for example, a dynamic random access memory (DRAM), a static random access memory (SRAM), a flash memory, an electrically erasable programmable read-only memory (EEPROM), a phase change random access memory (PRAM), or a magnetic random access memory (MRAM). The non-memory device may be, for example, a logic device (e.g., a microprocessor, a digital signal processor, or a microcontroller) or a similar device.

Specifically, the plurality of conductive through vias 20 may include first conductive through vias 21 and second conductive through vias 22. Each of the first conductive through vias 21 penetrates at least two layers of dies, and each of the second conductive through vias 22 penetrates only one layer of die. During electrical connection of the plurality of dies, since it is difficult to provide the first conductive through vias 21, the first conductive through vias 21 and the second conductive through vias 22 are provided at the same time. This can reduce the packaging difficulty of the dies on the one hand, and on the other hand, the first conductive through vias 21 and the second conductive through vias 22 can have a plurality of combination manners, so as to provide more options for the packaging process of the dies.

Specifically, along a stacking direction of the dies, the plurality of conductive through vias 20 electrically connect the plurality of dies sequentially, and an interconnecting structure 30 is arranged between adjacent conductive through vias 20. The interconnecting structure 30 is located in the interlayer dielectric layer. In this way, the conductive through vias 20 on adjacent dies are electrically connected through the interconnecting structure 30, thereby electrically connecting the plurality of dies. The interconnecting structure 30 may have a shape of a flat circular plate. In some examples, the interconnecting structure 30 may also have a shape of an oval or polygonal plate. Specifically, the interconnecting structure 30 has a vertical dimension or height, i.e., it may be columnar. A material of the interconnecting structure 30 may be Al, Cu, Ni, W, Pt, or Au. It should be noted that, as shown in FIG. 2, two interconnecting structures 30 can be provided between some adjacent dies, and the conductive through via 20 of each die is electrically connected to the corresponding interconnecting structure 30, and the two interconnecting structures 30 abut against each other.

Specifically, each of the first conductive through vias 21 penetrates all the interlayer dielectric layer(s) between the at least two layers of dies. In this way, the first conductive through via 21 penetrates all the dies and interlayer dielectric layer(s), to directly electrically connect the penetrated dies.

Specifically, each of the conductive through vias 20 includes: a through via, where the through via penetrates the dies; an insulating layer, where the insulating layer is located on an inner wall surface of the through via; a barrier layer, where the barrier layer is located on a surface of the insulating layer; and a conductive structure, where the conductive structure is located on a surface of the barrier layer and fills the through via.

This can improve the conductivity of the conductive through via 20, and the insulating layer can isolate the conductive structure from the semiconductor base and the circuit on the semiconductor base to avoid short circuit, thus ensuring the storage performance of semiconductor structure 100.

Specifically, end portions of the insulating layer, the barrier layer, and the conductive structure are all flush with an opening of the through via. This allows the die to have a flat surface, which on the one hand ensures the stability of the electrical connection, and on the other hand makes it easy to connect with other dies in a stack.

In a possible implementation, as shown in FIG. 3, FIG. 4 and FIG. 5, each of the first conductive through vias 21 penetrates two layers of dies and the interlayer dielectric layer between the two layers of dies. Specifically, in FIG. 3, the conductive through vias 20 include only the first conductive through vias 21; in FIG. 4 and FIG. 5, the conductive through vias 20 include the first conductive through vias 21 and the second conductive through vias 22. The difference between the two settings is that the setting in FIG. 4 is more regular, and the conductive through vias 20 in the same die are of the same type. In FIG. 5, there are two types of conductive through vias 20 in the same die. Such a setting method that each of the conductive through vias 20 penetrates two layers of dies at most can reduce the packaging difficulty of the semiconductor structure 100.

In another possible implementation, as shown in FIG. 6 and FIG. 7, each of the first conductive through vias 21 penetrates three layers of dies and the interlayer dielectric layer between every two adjacent layers of dies. Specifically, in FIG. 6, the conductive through vias 20 in the same die are of the same type; in FIG. 7, there are two types of conductive through vias 20 in the same die. Such a setting method that each of the conductive through vias 20 penetrates three layers of dies at most can further reduce the thickness of the semiconductor structure 100.

It should be noted that, the semiconductor structure 100 may include two or more dies that are stacked together. As shown in FIG. 2, in the same semiconductor structure 100, there may be conductive through vias 20 that penetrate one layer of die, conductive through vias 20 that penetrate two layers of dies, conductive through vias 20 that penetrate three layers of dies, or conductive through vias 20 that penetrate more layers of dies. The number of layers penetrated by the conductive through vias 20 and the arrangement manner thereof are not limited in the embodiments of the present disclosure.

It should be noted that, an interconnecting structure 30 may be provided between the first conductive through via 21 and the second conductive through via 22 that are located in the same vertical direction for electrical connection, or the first conductive through via 21 and the second conductive through via 22 in the same vertical direction may not be electrically connected, as shown in FIG. 8. Whether to electrically connect adjacent conductive through vias 20 in the vertical direction depends on actual conditions; it is not limited in the embodiments of the present disclosure.

In a possible implementation, each of the conductive through vias 20 has a pore diameter ranging from 2 to 10 μm. The pore diameter specifically can be 2 μm, 3 μm, 5 μm, 6 μm, 8 μm or 10 μm. The pore diameter of the conductive through via 20 being in the foregoing range can improve the conductivity of the conductive through via 20 on the one hand, facilitate the manufacturing of the conductive through via 20 on the other hand, and also reduce the space occupied by the conductive through via 20, thus reducing the size of the semiconductor structure 100.

In a possible implementation, along the stacking direction of the dies, the interconnecting structure 30 has a thickness ranging from 60 to 200 μm. The thickness specifically can be 60 μm, 90 μm, 110 μm, 130 μm, 170 μm or 200 μm. The thickness of the interconnecting structure 30 being in the foregoing range can make the electrical connection performance of the interconnecting structure 30 and the conductive through vias 20 stable on the one hand, and reduce the space occupied by the interconnecting structure 30 on the other hand, thus reducing the size of the semiconductor structure 100.

In a possible implementation, as shown in FIG. 2, along an extension direction of the dies, the first conductive through vias 21 and the second conductive through vias 22 are arranged at intervals. The extension direction of the dies refers to the direction of the die planes. In this way, the die is provided with conductive through vias 20 at different positions, such that different positions of the die can be electrically to other dies conveniently.

In a possible implementation, as shown in FIG. 4, in the plurality of dies, the first conductive through vias 21 penetrate some of the dies, and the second conductive through vias 22 penetrate the rest of the dies. The first conductive through vias 21 and the second conductive through vias 22 are electrically connected. In this way, in the vertical direction, all the dies can be electrically connected through the combination of the first conductive through vias 21 and the second conductive through vias 22.

Specifically, extension directions of adjacent first conductive through via 21 and second conductive through via 22 in the vertical direction are located in the same straight line. In this way, the first conductive through via 21 and the second conductive through via 22 are not staggered from each other, thus reducing the overall size of the interconnecting structure 30.

In a possible implementation, a material of the first conductive through vias 21 is the same as that of the second conductive through vias 22. Specifically, the insulating layer may include at least one of an oxide layer and a nitride layer, where the oxide layer and the nitride layer are specifically strictures formed by an oxide or a nitride; in addition, the insulating layer may also be a polymer or a combination of a polymer and an oxide or a nitride. The barrier layer may include a tantalum layer, which may be a structure formed by tantalum; in addition, the material of the barrier layer may also be Ti, TiN, TaN, Ru, Co, Mn, WN, or Ni. A material of the conductive structure may include one or more of Cu, W, Ag, Al, Ti, Au and Sn. This improves conductivity of the conductive through vias 20 and avoids short circuit, which ensures the storage performance of the semiconductor structure 100, and also increases the variety of materials used for the conductive through via 20, making it easy to set the conductive through vias 20.

Figure 9A:
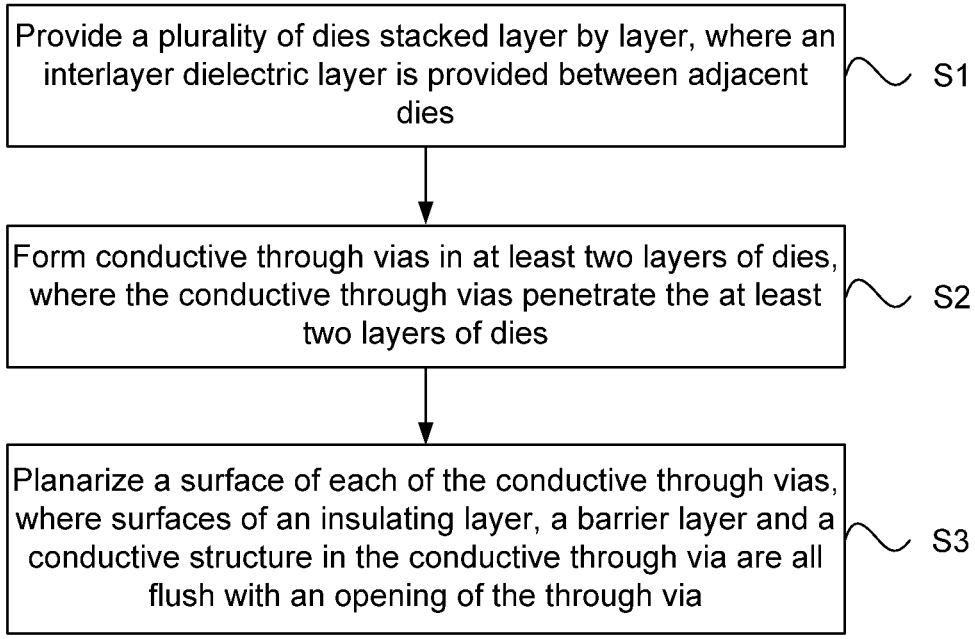
FIG. 9A is a schematic flowchart of a method of manufacturing a semiconductor structure according to an embodiment of the present disclosure.
Figure 9B:
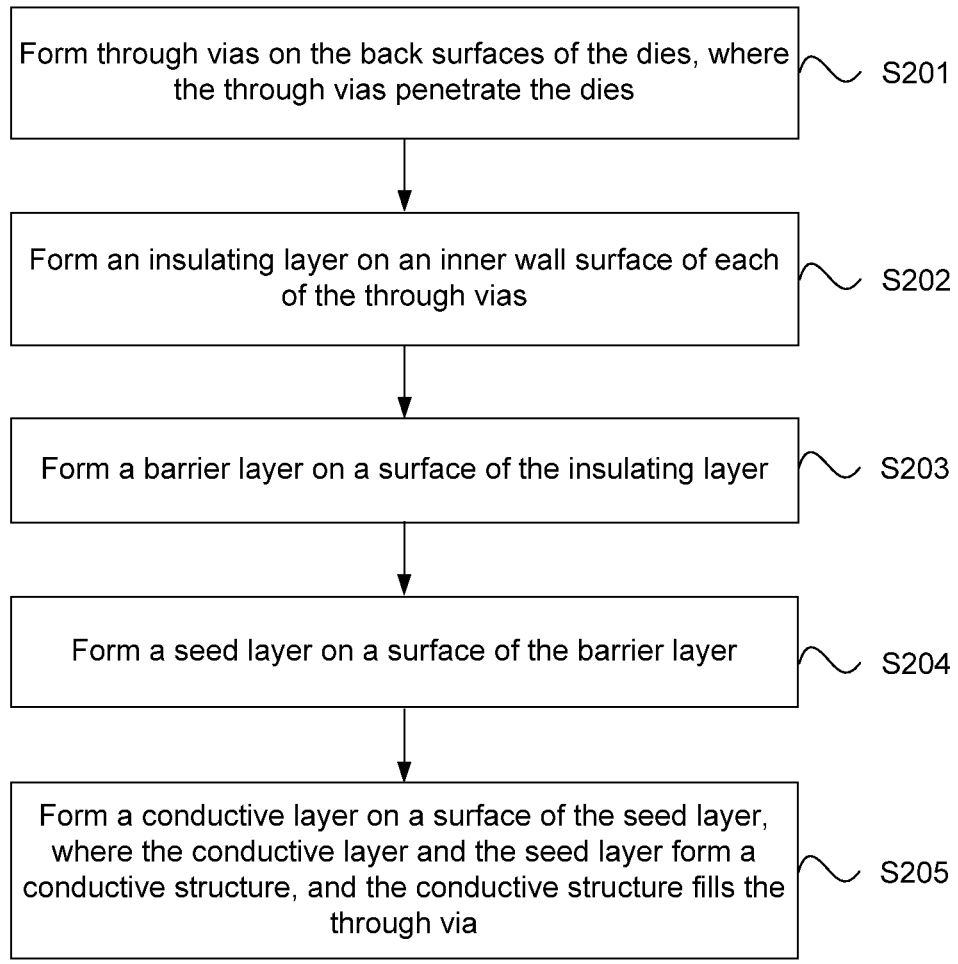
FIG. 9B is a schematic flowchart of a method of manufacturing conductive through vias according to an embodiment of the present disclosure.
Figure 10:
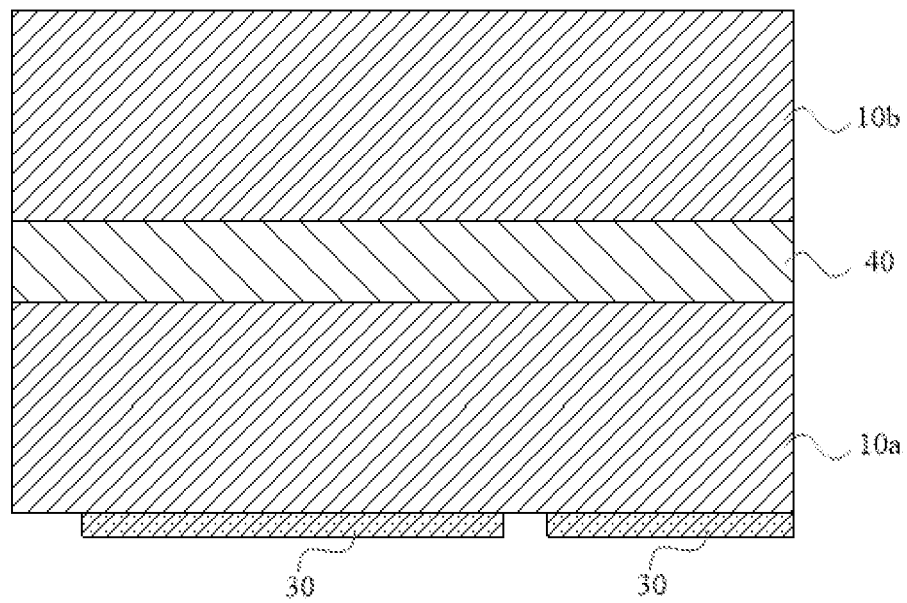
FIG. 10 is a schematic structural diagram of stacked dies according to an embodiment of the present disclosure.
Figure 11:
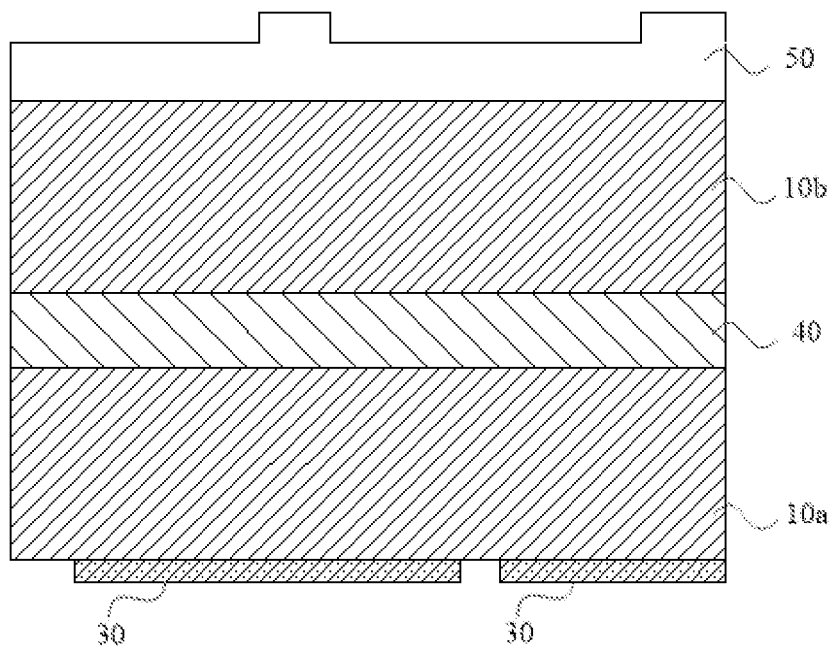
FIG. 11 is a schematic structural diagram of dies after deposition of a rewiring layer according to an embodiment of the present disclosure.
Figure 12:
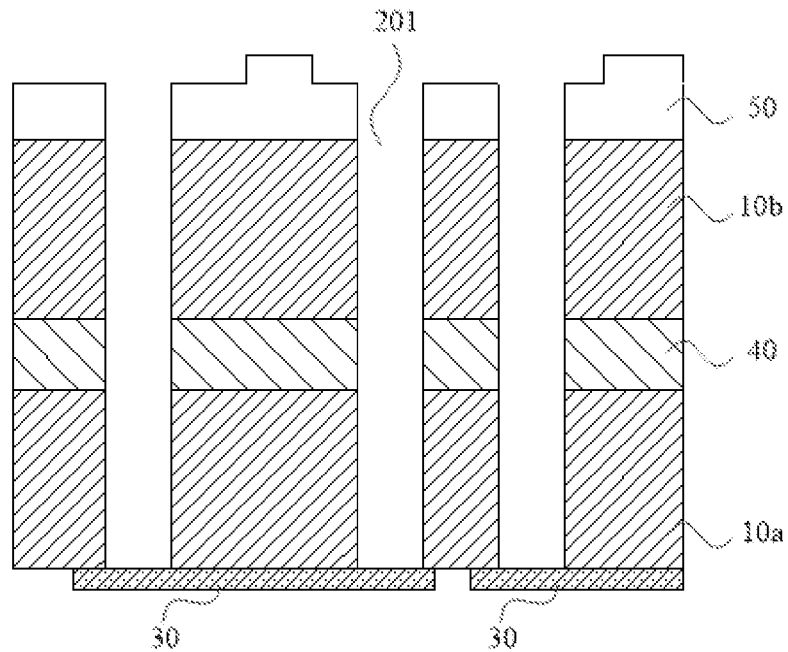
FIG. 12 is a schematic structural diagram of dies after etching of through vias according to an embodiment of the present disclosure.
Figure 13:
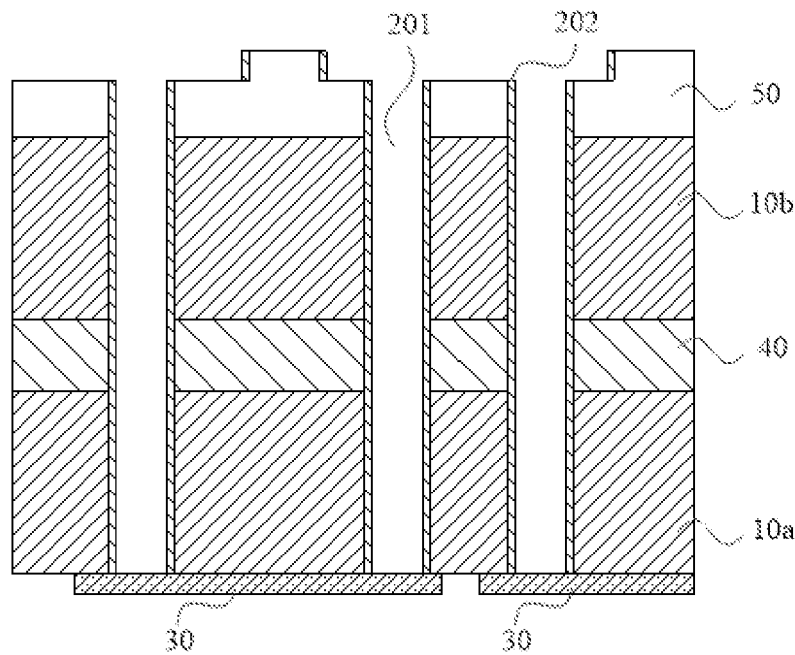
FIG. 13 is a schematic structural diagram of dies after deposition of insulating layers according to an embodiment of the present disclosure.
Figure 14:
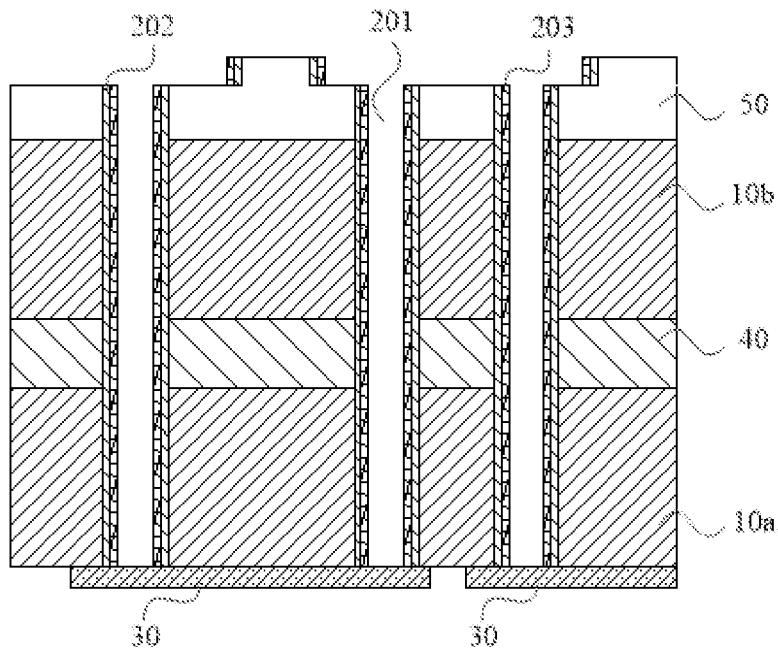
FIG. 14 is a schematic structural diagram of dies after deposition of barrier layers according to an embodiment of the present disclosure.
Figure 15:
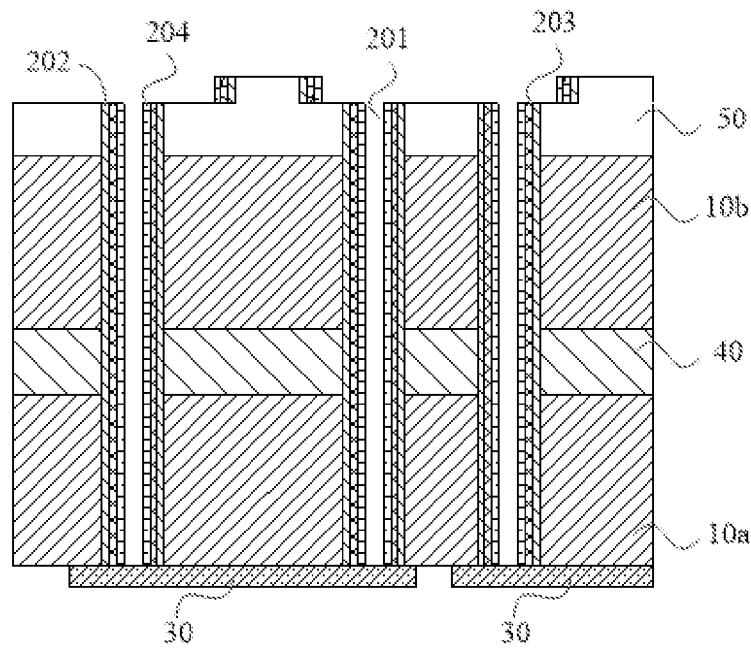
FIG. 15 is a schematic structural diagram of dies after deposition of seed layers according to an embodiment of the present disclosure.
Figure 16:
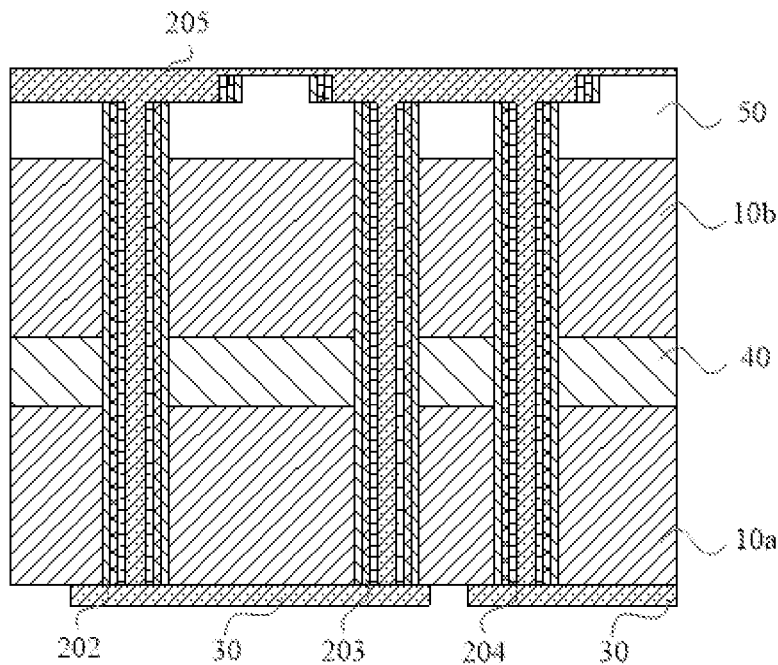
FIG. 16 is a schematic structural diagram of dies after deposition of a conductive layer according to an embodiment of the present disclosure.
Figure 17:
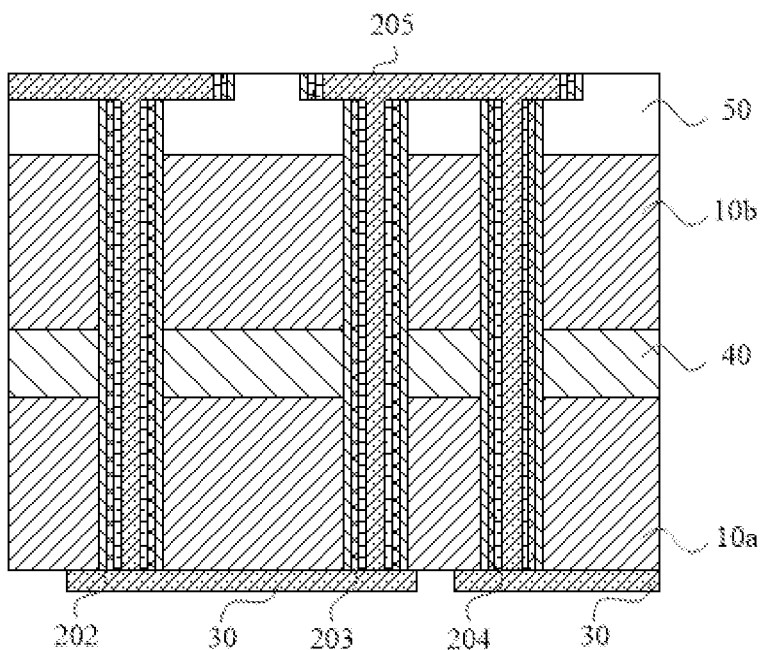
FIG. 17 is a schematic structural diagram of dies after a planarization process according to an embodiment of the present disclosure.

FIG. 9A is a schematic flowchart of a method of manufacturing a semiconductor structure according to an embodiment of the present disclosure. FIG. 9B is a schematic flowchart of a method of manufacturing conductive through vias according to an embodiment of the present disclosure. FIG. 10 is a schematic structural diagram of stacked dies according to an embodiment of the present disclosure. FIG. 11 is a schematic structural diagram of dies after deposition of a rewiring layer according to an embodiment of the present disclosure. FIG. 12 is a schematic structural diagram of dies after etching of through vias according to an embodiment of the present disclosure. FIG. 13 is a schematic structural diagram of dies after deposition of insulating layers according to an embodiment of the present disclosure. FIG. 14 is a schematic structural diagram of dies after deposition of barrier layers according to an embodiment of the present disclosure. FIG. 15 is a schematic structural diagram of dies after deposition of seed layers according to an embodiment of the present disclosure. FIG. 16 is a schematic structural diagram of dies after deposition of a conductive layer according to an embodiment of the present disclosure. FIG. 17 is a schematic structural diagram of dies after a planarization process according to an embodiment of the present disclosure. As shown in FIG. 9 to FIG. 17, according to a second aspect, an embodiment of the present disclosure provides a method of manufacturing a semiconductor structure.

As shown in FIG. 9A, the method of manufacturing a semiconductor structure includes the following steps:

S1: Provide a plurality of dies stacked layer by layer, where an interlayer dielectric layer is provided between every two adjacent dies. As shown in FIG. 10, a first die 10*a* and a second die 10*b* are stacked, and an interlayer dielectric layer 40 is located between the adjacent dies; then the back surfaces of the dies is thinned, and after the thinning is completed, as shown in FIG. 11, a rewiring layer 50 is formed by a lithography and etching process. It should be noted that an interconnecting structure 30 can be located in the rewiring layer 50.

S2: Form conductive through vias in at least two layers of dies, where the conductive through vias penetrate the at least two layers of dies. In this step, before etching from the back of the die to form a through via 201 in this embodiment of the present disclosure, the interconnecting structure 30 should be formed on the front surface of the die, such that the conductive through via directly falls on the interconnecting structure 30.

S3: Planarize a surface of each of the conductive through vias, where surfaces of an insulating layer, a barrier layer and a conductive structure in the conductive through via are all flush with an opening of the through via. The structure after the planarization process is as shown in FIG. 17. Specifically, the planarization process can be performed using a chemical mechanical polishing (CMP) process. This makes the electrical connection between the conductive through via and the interconnecting structure 30 more reliable and improves the storage performance of the semiconductor structure 100.

Specifically, as shown in FIG. 9B, the method of manufacturing the conductive through vias may include the following steps:

S201: Form through vias on the back surfaces of the dies, where the through vias penetrate the dies. As shown in FIG. 12, each of the through vias 201 penetrates the first die 10*a* and the second die 10*b*.

S202: Form an insulating layer on an inner wall surface of each of the through vias. After the insulating layer is formed, the through via 201 is further etched, to remove the insulating layer 202 deposited on a surface of the interconnecting structure 30 and only retain the insulating layer 202 on sidewalls of the through via 201; the surface of the interconnecting structure 30 is exposed, to facilitate subsequent deposition of the barrier layer 203. The structure after deposition of the insulating layer 202 and removal of the excess insulating layer 202 is as shown in FIG. 13; the insulating layer 202 may include one or more of an oxide, a nitride or a polymer.

S203: Form a barrier layer on a surface of the insulating layer. After the barrier layer 203 is formed, the through via 201 is further etched, to remove the barrier layer 203 deposited on the surface of the interconnecting structure 30 and retain only the barrier layer 203 on the sidewalls of the through via 201; the surface of the interconnecting structure 30 is exposed, to facilitate subsequent deposition of the seed layer 204. The structure after deposition of the barrier layer 203 and removal of the excess barrier layer is as shown in FIG. 14. A material of the barrier layer 203 may include one or more of Ti, TiN, Ta, TaN, Ru, Co, Mn, WN or Ni.

S204: Form a seed layer on a surface of the barrier layer. The structure after deposition of the seed layer 204 is as shown in FIG. 15. Deposition of the seed layer 204 facilitates subsequent growth of a conductive layer 205. A material of the seed layer 204 may be Cu, W, Ag, Al, Ti, Au or Sn.

S205: Form a conductive layer on a surface of the seed layer, where the conductive layer and the seed layer form a conductive structure, and the conductive structure fills the through via. The conductive layer 205 may be deposited through electroplating. The structure after deposition of the conductive layer 205 is as shown in FIG. 16. The conductive structure is connected to the interconnecting structure 30 in the interlayer dielectric layer 40. A material of the conductive layer 205 may be Cu, W, Ag, Al, Ti, Au or Sn.

In the method of manufacturing a semiconductor structure provided by the embodiments of the present disclosure, the interlayer dielectric layer 40 is provided, which can fill the gap between adjacent dies on the one hand, and on the other hand, can connect the adjacent dies, thus improving the stability of the stacked dies. By providing a plurality of conductive through vias 20, the plurality of dies can be electrically connected to each other. The conductive through vias 20 penetrate at least two layers of dies. On the one hand, the planarization process on the conductive through vias 20 of adjacent dies is avoided, thereby preventing a flatness difference due to excessive grinding on the metal layer of the conductive through vias 20. On the other hand, delamination or bulging during thermal treatment can be avoided after bonding of the interconnecting structure 30 and the conductive through vias 20. The settings described above reduce the impact of the flatness of the conductive through vias 20 on the performance of the semiconductor structure 100. In addition, because the adjacent dies are electrically connected by using the same conductive through via 20, it is unnecessary to provide an interconnecting structure 30 between the adjacent dies, thus reducing the overall size of the semiconductor structure 100.

In the above description of the embodiments of the present disclosure, unless otherwise clearly specified, the terms such as "mounting", "interconnection", "connection" and "fixation" are intended to be understood in a broad sense. For example, the "connection" may be a fixed connection, an indirect connection via a medium, or a communication or interaction between two elements. Those of ordinary skill in the art may understand the specific meanings of the above terms in the present disclosure based on the specific situation. The terms such as "upper", "lower", "front", "rear", "vertical", "horizontal", "top", "bottom", "inside" and "outside" indicate the orientation or position relationships based the drawings. They are merely intended to facilitate and simplify the description of the present disclosure, rather than to indicate or imply that the mentioned device or components must have a specific orientation or must be constructed and operated in a specific orientation. Therefore, these terms should not be construed as a limitation to the present disclosure. In the description of the present disclosure, "a plurality of" means two or more, unless otherwise specifically defined.

The terms "first", "second", "third" and "fourth" (if any) in the description and claims of present disclosure and in the above drawings are intended to distinguish between similar objects without necessarily indicating a specific order or sequence. It should be understood that the data used in such a way may be exchanged under proper conditions, such that the described embodiments of the present disclosure may be implemented in a sequence other than those illustrated or described herein, for example. Moreover, the terms "include", "comprise", and any other variants mean to cover the non-exclusive inclusion, for example, a process, method, system, product, or device that includes a list of steps or units is not necessarily limited to those steps or units which are clearly listed, but may include other steps or units which are not expressly listed or inherent to such a process, method, system, product, or device.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present disclosure.

The invention claimed is:

1. A semiconductor structure, comprising:
a plurality of dies, wherein the plurality of dies are stacked layer by layer;
one or more interlayer dielectric layers, wherein each of the interlayer dielectric layers is located between adjacent dies; and
a plurality of conductive through vias, wherein at least one of the plurality of conductive through vias penetrates at least two layers of dies and electrically connects the at least two layers of dies.

2. The semiconductor structure according to claim 1, wherein the plurality of conductive through vias comprise first conductive through vias and second conductive through vias, each of the first conductive through vias penetrates at least two layers of dies, and each of the second conductive through vias penetrates only one layer of die.

3. The semiconductor structure according to claim 2, wherein along a stacking direction of the dies, the plurality of conductive through vias electrically connect the plurality of dies sequentially, and an interconnecting structure is arranged between adjacent conductive through vias; and
the interconnecting structure is located in the interlayer dielectric layer.

4. The semiconductor structure according to claim 3, wherein each of the first conductive through vias penetrates the interlayer dielectric layer or all the interlayer dielectric layers between the at least two layers of dies.

5. The semiconductor structure according to claim 2, wherein each of the conductive through vias comprises:
a through via, wherein the through via penetrates the dies;
an insulating layer, wherein the insulating layer is located on an inner wall surface of the through via;
a barrier layer, wherein the barrier layer is located on a surface of the insulating layer; and
a conductive structure, wherein the conductive structure is located on a surface of the barrier layer and fills the through via.

6. The semiconductor structure according to claim 5, wherein end portions of the insulating layer, the barrier layer, and the conductive structure are all flush with an opening of the through via.

7. The semiconductor structure according to claim 2, wherein each of the first conductive through vias penetrates two layers of dies and the interlayer dielectric layer between the two layers of dies; or
each of the first conductive through vias penetrates three layers of dies and the interlayer dielectric layer between every two adjacent layers of dies.

8. The semiconductor structure according to claim 3, wherein at least one of each of the conductive through vias has a pore diameter ranging from 2 to 10 µm; or
along the stacking direction of the dies, each of the interconnecting structures has a thickness ranging from 60 to 200 µm.

9. The semiconductor structure according to claim 2, wherein along an extension direction of the dies, the first conductive through vias and the second conductive through vias are arranged at intervals.

10. The semiconductor structure according to claim 2, wherein in the plurality of dies, the first conductive through vias penetrate some of the dies, and the second conductive through vias penetrate the rest of the dies; and
the first conductive through vias and the second conductive through vias are electrically connected.

11. The semiconductor structure according to claim 10, wherein extension directions of adjacent first conductive through via and second conductive through via in a vertical direction are located in the same straight line.

12. The semiconductor structure according to claim 5, wherein a material of the first conductive through vias is the same as a material of the second conductive through vias; and the insulating layer comprises at least one of an oxide layer and a nitride layer; and/or the barrier layer comprises a tantalum layer; and a material of the conductive structure comprises one or more from the group consisting of copper, tungsten, silver, aluminum, titanium, gold, and tin.

13. A method of manufacturing a semiconductor structure, comprising:
providing a plurality of dies being stacked layer by layer, wherein an interlayer dielectric layer is provided between every two adjacent dies; and
forming conductive through vias in at least two layers of dies, wherein each of the conductive through vias penetrates the at least two layers of dies.

14. The method of manufacturing a semiconductor structure according to claim 13, wherein the forming conductive through vias in at least two layers of dies, wherein each of the conductive through vias penetrates the at least two layers of dies comprises:
forming through vias on back surfaces of the dies, wherein each of the through vias penetrates the dies;
forming an insulating layer on an inner wall surface of each of the through vias;
forming a barrier layer on a surface of the insulating layer;
forming a seed layer on a surface of the barrier layer; and
forming a conductive layer on a surface of the seed layer, wherein the conductive layer and the seed layer form a conductive structure, and the conductive structure fills the through via;
wherein the conductive structure is electrically connected to an interconnecting structure in the interlayer dielectric layer.

15. The method of manufacturing a semiconductor structure according to claim 14, after the forming a conductive layer on a surface of the seed layer, wherein the conductive layer and the seed layer form a conductive structure, and the conductive structure fills the through via, the method further comprises:
planarizing a surface of the conductive through via, wherein the surfaces of the insulating layer, the barrier layer and the conductive structure in the conductive through via are all flush with an opening of the through via.

* * * * *